US010026166B2

(12) United States Patent
Jeong

(10) Patent No.: US 10,026,166 B2
(45) Date of Patent: Jul. 17, 2018

(54) METHODS OF DETECTING DEFECTS IN REGISTRATION CONTROLLED PHOTOMASKS

(71) Applicant: SK hynix Inc., Icheon-si, Gyeonggi-do (KR)

(72) Inventor: Goo Min Jeong, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 208 days.

(21) Appl. No.: 14/988,471

(22) Filed: Jan. 5, 2016

(65) Prior Publication Data
US 2017/0039693 A1 Feb. 9, 2017

(30) Foreign Application Priority Data

Aug. 4, 2015 (KR) .................. 10-2015-0110095

(51) Int. Cl.
*G06T 7/00* (2017.01)
*G03F 1/00* (2012.01)
*G06T 7/30* (2017.01)

(52) U.S. Cl.
CPC ............ *G06T 7/001* (2013.01); *G06T 7/0024* (2013.01); *G03F 1/00* (2013.01); *G03F 1/003* (2013.01); *G06T 7/30* (2017.01); *G06T 2207/30148* (2013.01); *H05K 2203/16* (2013.01); *H05K 2203/166* (2013.01)

(58) Field of Classification Search
None
See application file for complete search history.

(56) References Cited

U.S. PATENT DOCUMENTS

| 5,513,275 | A | * | 4/1996 | Khalaj | G03F 1/84 |
| | | | | | 348/126 |
| 6,340,543 | B1 | * | 1/2002 | Nagamura | G03F 1/26 |
| | | | | | 250/492.22 |
| 6,526,164 | B1 | * | 2/2003 | Mansfield | G03F 7/7065 |
| | | | | | 356/237.1 |
| 7,796,249 | B2 | * | 9/2010 | Wang | G03F 1/82 |
| | | | | | 356/237.1 |
| 9,739,723 | B1 | * | 8/2017 | Jeong | G01N 21/95607 |
| 2006/0170934 | A1 | * | 8/2006 | Picciotto | B82Y 10/00 |
| | | | | | 356/625 |
| 2006/0199286 | A1 | * | 9/2006 | Sato | G06T 7/0004 |
| | | | | | 438/14 |

(Continued)

FOREIGN PATENT DOCUMENTS

KR 1020060122191 A 11/2006
KR 1020150036789 A 4/2015

*Primary Examiner* — Vu Le
*Assistant Examiner* — Samah Beg
(74) *Attorney, Agent, or Firm* — William Park & Associates Ltd.

(57) ABSTRACT

A method of detecting defects of a photomask includes measuring registration errors of the photomask, correcting the measured registration errors using a registration control process with a laser beam, extracting deformation data of the photomask deformed by the registration control process, reflecting the extracted deformation data in defect detection parameters to obtain compensated defect detection parameters, and detecting defects of the photomask using the compensated defect detection parameters.

18 Claims, 5 Drawing Sheets

(56) References Cited

U.S. PATENT DOCUMENTS

| | | | |
|---|---|---|---|
| 2006/0269118 A1* | 11/2006 | Lee | G03F 1/84 382/144 |
| 2007/0047800 A1* | 3/2007 | Hiroi | G06T 7/0004 382/149 |
| 2007/0069154 A1* | 3/2007 | Sullivan | G01N 23/04 250/491.1 |
| 2008/0187842 A1* | 8/2008 | Hung | G03F 1/84 430/5 |
| 2008/0260234 A1* | 10/2008 | Yamashita | G01N 21/95607 382/144 |
| 2013/0271595 A1* | 10/2013 | Hiroi | G01B 15/00 348/80 |
| 2014/0037187 A1* | 2/2014 | Marcuccilli | G06T 7/0004 382/149 |
| 2014/0270475 A1* | 9/2014 | Huang | G06T 7/0004 382/149 |
| 2014/0356983 A1* | 12/2014 | Lin | H01L 21/02035 438/7 |
| 2015/0036717 A1* | 2/2015 | Sato | G03F 7/70633 374/56 |
| 2015/0050584 A1* | 2/2015 | Choi | G03F 1/72 430/5 |
| 2015/0079500 A1* | 3/2015 | Shih | G03F 1/80 430/5 |
| 2015/0287622 A1* | 10/2015 | Wu | G03F 7/70141 355/67 |
| 2017/0241917 A1* | 8/2017 | Jeong | G01N 21/95607 |

\* cited by examiner

METHODS OF DETECTING DEFECTS IN REGISTRATION CONTROLLED PHOTOMASKS

CROSS-REFERENCE TO RELATED APPLICATIONS

The present application claims priority under 35 U.S.C. 119(a) to Korean Patent Application No. 10-2015-0110095, filed on Aug. 4, 2015, respectively, in the Korean Intellectual Property Office, which is incorporated herein by reference in its entirety as set forth in full.

BACKGROUND

1. Technical Field

Various embodiments of the present disclosure relate to methods of detecting defects in photomasks and, more particularly, to methods of detecting defects in registration controlled photomasks.

2. Related Art

As semiconductor devices become more highly integrated, a wavelength of light generated from a light source used in a lithography processes has been continuously reduced to improve pattern resolution. In such a case, growth defects known as "haze", which are not generated in a general lithography process using long wavelength light, may be formed on a photomask due to an increase in exposure energy during an exposure process. If haze is generated and grown to have a size over a certain value, photomask transmittance may be degraded to change an exposure energy of light irradiated onto a wafer. Accordingly, haze formed on the photomask may affect a yield of semiconductor devices.

SUMMARY

Various embodiments are directed to methods of detecting defects of photomasks.

According to an embodiment, there is provided a method of detecting defects on a photomask. The method includes measuring registration errors of the photomask, correcting the measured registration errors using a registration control process with a laser beam, extracting deformation data of the photomask deformed by the registration control process, reflecting the extracted deformation data in defect detection parameters to obtain compensated defect detection parameters, and detecting defects of the photomask using the compensated defect detection parameters.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by use of these terms. These terms are only used to distinguish one element from another element. Thus, a first element in some various embodiments could be termed a second element in other embodiments without departing from the teachings of the present disclosure.

It will also be understood that when an element is referred to as being located "on," "over," "above," "under," "beneath," "below," "side," or "aside" another element, the element may directly contact the other element, or at least one intervening element may be present therebetween. Accordingly, terms such as "on," "over," "above," "under," "beneath," "below," "side," "aside," and the like that are used herein are for the purpose of describing particular embodiments only and are not intended to limit the scope of the present disclosure.

It will be further understood that when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present.

Figure 1:
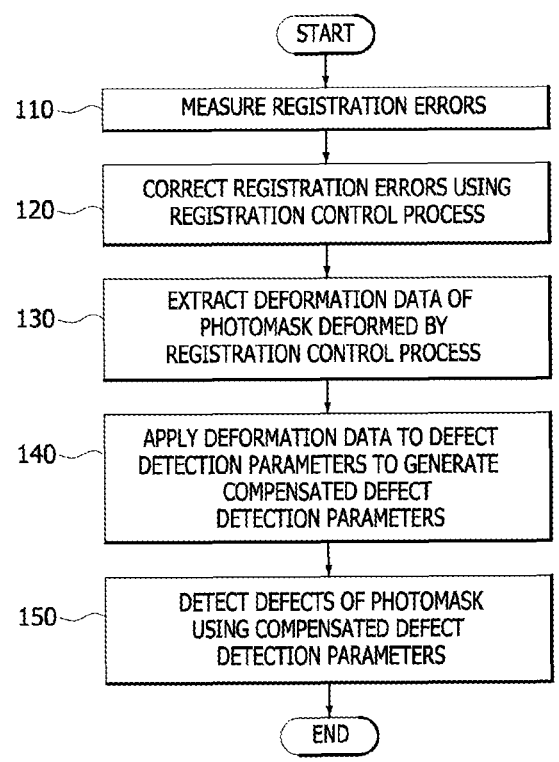
FIG. 1 is a process flowchart illustrating a method of detecting defects on a photomask according to an embodiment of the present disclosure.

FIG. 1 is a process flowchart illustrating a method of detecting defects on a photomask according to an embodiment of the present disclosure. Referring to FIG. 1, registration errors of a photomask may be measured (see step 110). The step of measuring registration errors of the photomask may be performed after photomask patterns are formed. The registration errors may be measured using a metrological apparatus. In some embodiments, after the photomask is loaded into the metrological apparatus, positions of various photomask patterns may be measured. The measured positions of the various photomask patterns may be compared with reference positions of the photomask patterns. As a result of the comparison, a variation of the pattern positions from the reference positions may be changed into numerical values or images to generate registration error data. While the registration errors of the photomask are measured, an overlay error between the photomask and a wafer may also be measured. Photomask overlay patterns may be transferred onto the wafer to measure the overlay error. The measured positions of the photomask overlay patterns may be compared with reference positions of the overlay patterns. As a result of the comparison, variation of the overlay pattern positions from the reference pattern positions may be changed into numeral values or images to generate overlay error data.

Figure 2:
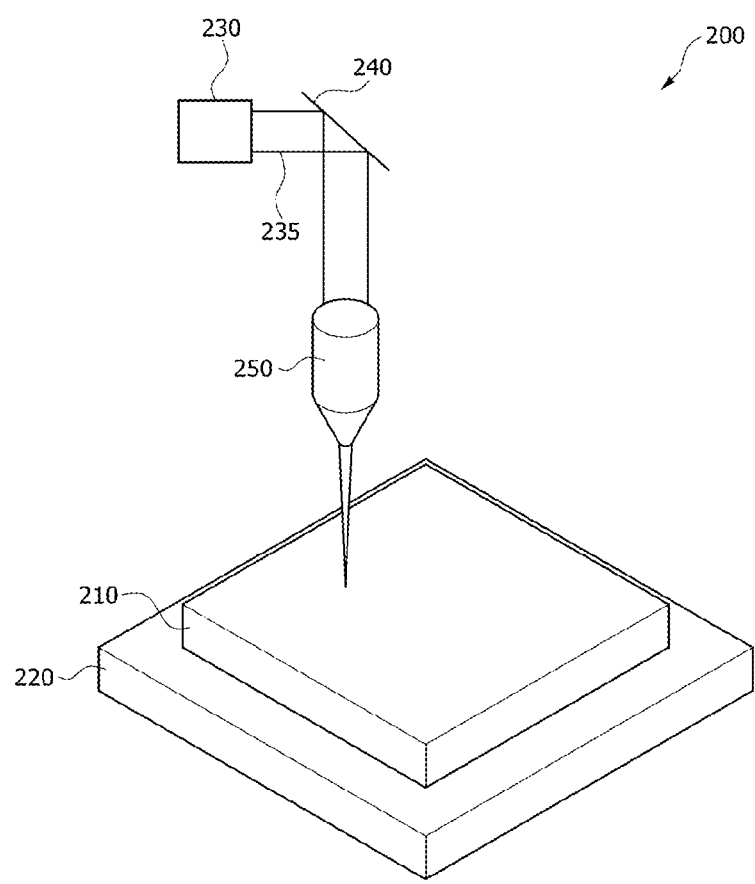
FIG. 2 is a schematic view illustrating a registration control system used in the method shown in FIG. 1 according to an embodiment of the present disclosure.

Subsequently, the measured registration errors may be corrected using a registration compensation process (also, referred to as a registration control process) performed with a laser beam (see step 120). While the registration errors are corrected, the overlay errors may also be corrected. The registration compensation process may be performed using a registration control system 200 illustrated in FIG. 2. As illustrated in FIG. 2, the registration control system 200 may include a chuck 220 on which is placed a photomask 210. In some embodiments, the chuck 220 may be movable in three dimensions. The registration control system 200 may further include a pulse laser source 230 for generating light such as a laser beam 235. The laser source 230 may generate a pulsed laser whose pulse width is controlled. Although FIG. 2 illustrates an example in which the registration control system 200 includes a single laser source 230, the present disclosure is not limited thereto. That is, the registration control system 200 may include two or more laser sources according to the embodiments. The registration control system 200 may further include a steering mirror 240 and a focusing objective lens 250 disposed between the laser source 230 and the photomask 210. The steering mirror 240 may reflect the pulsed laser beam 235 emitted from the laser source 230. The steering mirror 240 may reflect the pulsed laser beam 235 toward the focusing objective lens 250. The focusing objective lens 250 may focus the pulsed laser beam 235 on to the photomask 210. In some embodiments, the focusing objective lens 250 may be movable in three dimensions. The registration control process may be performed by irradiating the laser beam 235 onto the photomask 210 using the registration control system 200. The registration control process includes irradiating the laser beam 235 onto the photomask 210 to correct local position errors of photomask 210 patterns.

Figure 3:
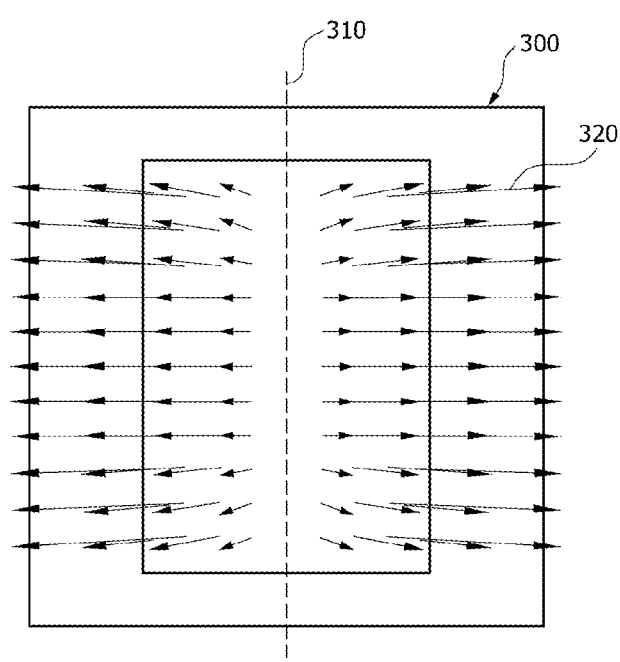
FIG. 3 illustrates an example of a registration controlled photomask according to an embodiment of the present disclosure.

Referring again to FIG. 1, detecting defects on a photomask may include extracting deformation data of the photomask 210 deformed by the registration control process (see step 130). The photomask 210 may be expanded in one or more directions during the registration control process. An example of a registration controlled photomask 300 deformed by the registration control process is illustrated in FIG. 3. Referring to FIG. 3, the photomask 300 may be expanded in two opposite directions from an intersecting central line 310 indicated by a dotted line. The photomask 300 may be expanded during the registration control process. During the registration control process, the laser beam 235 irradiated onto the photomask 300 may cause or generate a predictable deformation element in a light transmission substrate (e.g., a quartz substrate) of the photomask 300. This deformation of the photomask 300 may be described by a physical mathematical model that well represents the quartz substrate deformation caused by the registration control process. A deformed zone in the quartz substrate is a three-dimensional volume which has a slightly different morphological organization of atoms with a slightly less dense packing or lower density than the undeformed quartz substrate. A region having a lower density may expand and push away the adjacent atoms and thus deform the whole bulk of the quartz substrate. Registration errors may be corrected by the principle described above. As a result, the registration control process may cause expansion of the photomask 300. A degree of expansion of the photomask 300 may be expressed using vectors indicated by arrows 320. In some embodiments, magnitudes and orientations of the vectors may be determined by mode signatures, that is, parameters depending on a laser material. Thus, the registration control process for extracting deformation data of the photomask 300 may be performed with the mode signatures and laser irradiation conditions in mind. In some other embodiments, measurements concerning the deformation data of the photomask 300 may be extracted using a metrological apparatus. In such a case, the registration of the photomask 300 may be measured after performing the registration control process for the photomask 300, and the deformed data may be extracted by comparing the measured registration with an initial registration where the initial registration is measured before the registration control process is performed.

Referring again to FIG. 1, the extracted deformed data may be applied to defect detection parameters to obtain compensated defect detection parameters (see step 140). In some embodiments, if haze is detected as a defect of the photomask, the haze of the photomask may be detected using defect detection parameters input to the haze detection apparatus. In some embodiments, the defect detection parameters may include reference pattern image information. The reference pattern image information may include shapes and positions of patterns, which can be obtained by measurement after patterns of the photomask are formed. The reference pattern image information may correspond to information on the photomask to which the registration control process has not been applied. That is, the reference pattern image information may be obtained from the photomask before the registration control process is applied to the photomask. Thus, if haze is detected using the defect detection parameters with the photomask expanded by the registration control process, it may be difficult to detect the haze because of a variation of the pattern positions caused by photomask expansion.

Figure 4:
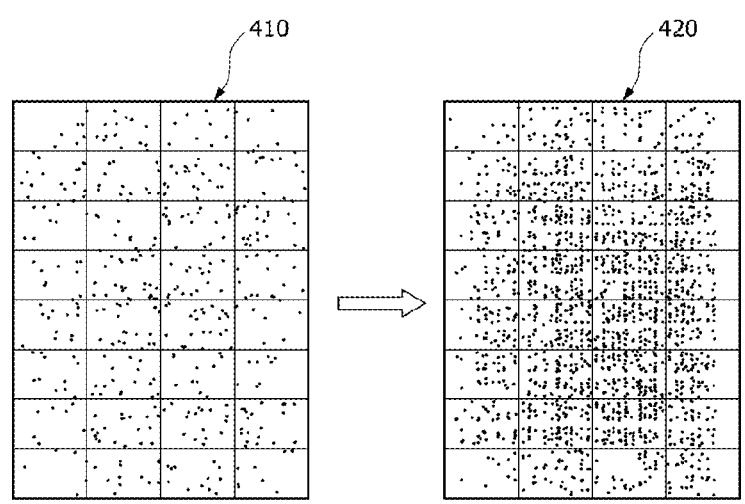
FIG. 4 illustrates defect detection results with and without a registration control process according to an embodiment of the present disclosure.

FIG. 4 illustrates defect detection results with and without a registration control process. Referring to FIG. 4, when the registration control process is not applied to a photomask 410, growth defects extracted by comparing the pattern image information of the photomask 410 with a reference pattern image may be shown in normal noise form as illustrated by dots because the photomask 410 is not expanded. In contrast, when the registration control process is applied to a photomask 420, the pattern image information may be distorted by expansion of the photomask 420. Thus, the growth defects may be shown in an abnormal noise form as illustrated by dots. This is because the haze detection process is performed without applying photomask 420 expansion variation of the pattern image information. The photomask 420 expansion variation may be cause by the defect detection parameters.

Figure 5:
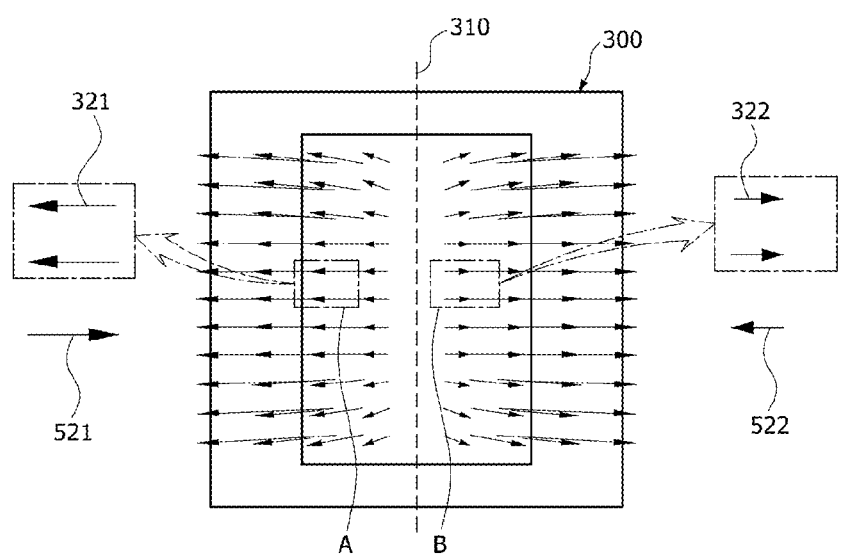
FIG. 5 is a schematic view illustrating a process in which deformation data extracted from the method shown in FIG. 1 is applied to defect detection parameters according to an embodiment of the present disclosure.

FIG. 5 is a schematic view illustrating a process in which deformation data extracted from the method shown in FIG. 1 are applied to defect detection parameters. Referring to FIG. 5, if the photomask 300 is expanded in two opposite directions from the intersecting central line 310, the pattern image information of the photomask 300 may be corrected to compensate for the deformation data extracted from the step 130, for example, the vectors constituting vector information. For example, a first compensation vector 521 having a same magnitude and an opposite orientation as first deformation data indicated by first vectors 321 in a region 'A' may be reflected in the pattern image information, as illustrated in FIG. 5. Similarly, a second compensation vector 522 having the same magnitude and an opposite orientation as second deformation data indicated by second vectors 322 in a region 'B' may be reflected in the pattern image information, as illustrated in FIG. 5. The process for reflecting the compensation vectors 521 and 522 in the pattern image information may be applied to all of regions of the photomask 300, particularly, to deformed regions of the photomask 300. As deformation data is reflected in the defect detection parameters, the pattern image information of the photomask, deformed by the registration control process, may be compensated to be the same as the pattern image information of the photomask to which the registration control process is not applied. Thus, compensated defect detection parameters may be obtained.

Referring again to FIG. 1, after the compensated defect detection parameters are obtained by reflecting the extracted deformation data in the defect detection parameters, defects of the photomask may be detected using the compensated defect detection parameters (see step 150).

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A method of detecting defects of a photomask, the method comprising:
    measuring registration errors of the photomask;
    correcting the measured registration errors using a registration control process with a laser beam;
    extracting deformation data of the photomask deformed by the registration control process;
    reflecting the extracted deformation data in defect detection parameters to obtain compensated defect detection parameters; and
    detecting defects of the photomask using the compensated defect detection parameters,
    wherein the photomask is expanded during the registration control process, and
    wherein the registration control process includes expanding the photomask two opposite directions from an intersecting line.

2. The method of claim 1, wherein measuring the registration errors of the photomask is performed after photomask patterns are formed.

3. The method of claim 1, wherein the registration control process is performed by irradiating the laser beam onto the photomask to correct local position errors of the photomask patterns.

4. The method of claim 1, wherein the deformation data of the photomask includes vector information on degrees of expansion of the photomask to which the registration control process is applied.

5. The method of claim 4, wherein reflecting the extracted deformation data in the defect detection parameters is performed by reflecting compensation vector information for compensating the vector information in the defect detection parameters in each of regions of the photomask.

6. The method of claim 5, wherein the compensation vector information includes information on compensation vectors having the same magnitudes and opposite orientations as vectors constituting the vector information.

7. The method of claim 1, wherein the defects of the photomask include haze.

8. The method of claim 1, wherein detecting defects of the photomask using the compensated defect detection parameters further comprises reflecting compensation vectors applied to all regions of the photomask.

9. The method of claim 1, wherein registration errors are measured by a metrological apparatus.

10. The method of claim 1 further comprising correcting overlay error while correcting measured registration errors.

11. The method of claim 1 further comprising performing a registration compensation process with a registration control system, wherein the measured registration error are corrected using the registration compensation process.

12. The method of claim 1 further comprising, during the registration control process, using a laser beam to irradiate the photomask to generate a deformation in a quartz substrate of the photomask.

13. The method of claim 1 further comprising extracting measurements of the deformation data of the photomask using a metrological apparatus.

14. The method of claim 1 further comprising measuring the registration of the photomask after performing a registration control process.

15. The method of claim 1 wherein an initial registration is measured before the registration control process is performed.

16. The method of claim 1, wherein extracted deformed data is applied to the defect detection parameters to obtain compensated defect detection parameters.

17. The method of claim 1, wherein the defect detection parameters include reference pattern image information.

18. The method of claim 17, wherein the reference pattern image information is obtained from the photomask before the registration control process.

* * * * *